United States Patent [19]
Takasaki et al.

[11] 4,429,325
[45] Jan. 31, 1984

[54] PHOTOSENSOR

[75] Inventors: Yukio Takasaki, Hachioji; Tadaaki Hirai, Koganei; Hideaki Yamamoto, Hachioji; Toshihisa Tsukada, Sekimachi; Yoshiaki Mori, Hamuramachi, all of Japan

[73] Assignee: Hitachi, Ltd., Tokyo, Japan

[21] Appl. No.: 206,780

[22] Filed: Nov. 14, 1980

[30] Foreign Application Priority Data

Nov. 14, 1979 [JP] Japan .................. 54/146579

[51] Int. Cl.$^3$ ............................ H01L 27/14
[52] U.S. Cl. ...................... 357/31; 357/16; 357/30
[58] Field of Search ................ 357/31, 30, 16

[56] References Cited

U.S. PATENT DOCUMENTS 4,007,473  2/1977  Nonaka .................. 357/31
4,236,829  12/1980  Chikamura ............ 357/31 X
4,360,821  11/1982  Tsukada ................ 357/31

Primary Examiner—Martin H. Edlow
Attorney, Agent, or Firm—Antonelli, Terry & Wands

[57] ABSTRACT

In a photosensor having a metal electrode, at least one photoelectric conversion layer which overlies the metal electrode, and a transparent or partly transparent conductive layer which overlies the photoelectric conversion layer, a recombination layer for recombining electrons and holes is disposed between the metal electrode and the photoelectric conversion layer. By disposing the recombination layer, the metal electrode having an insulating oxide film on its surface can be handled as if the insulating oxide film were not existent. The dark current is suppressed, and the photo-response is made good. As the materials of the recombination layer, $Sb_2S_3$, $As_2Se_3$, $As_2S_3$, $Sb_2Se_3$ etc. are typical.

12 Claims, 14 Drawing Figures

PHOTOSENSOR

BACKGROUND OF THE INVENTION

1. Field of the Invention

This invention relates to a photosensor. The photosensor of this invention can be used for a solid-state imager, a line sensor, a solar battery etc.

2. Description of the Prior Art

As the construction of the photoelectric conversion portion of a photosensor which is applied to a solid-state imager, a line sensor etc., there has been known a structure in which a photoconductive layer is formed in a manner to overlie and cover metal electrodes disposed on a body.

A typical example of such photosensor is a solid-state imager in which the photoconductive layer forming an imaging face is arranged so as to cover the semiconductor body formed with switching elements, scanning circuitry etc. for taking out electric signals from photoelectric elements arrayed in the shape of a matrix.

The principle of the construction of the photoelectric conversion portion is illustrated in FIG. 1.

Referring to FIG. 1, numeral 1 designates a transparent electrically-conductive layer on a light projecting side, numeral 2 a photoelectric conversion layer whose basic material is amorphous Se, numeral 3 a metal electrode which is opposite to the light projecting side, numeral 4 a voltage source which functions to drive the photoelectric conversion layer, and numeral 5 a switch which typifies a scanning circuit. Since the photoelectric conversion layer is, in general, made of a high-resistivity material, the photoelectric conversion portion shown in FIG. 1 can be regarded as a capacitive device.

By closing the switch 5 for an instant under the state under which light is not projected, negative charges $-Q$ corresponding to the supply voltage 4 are induced on the metal electrode 3. While the switch 5 is subsequently open, holes 7 generated in the photoelectric conversion layer 2 by thermal excitation or by light projection 6 travel towards the metal electrode 3, and positive charges q ($q \ll Q$) are induced on the metal electrode 3. Ultimately, the charges on the metal electrode 3 amount to $-Q +q$. When the switch 5 is subsequently closed, negative charges 8 of $-q$ are supplied from the voltage source 4 towards the metal electrode 3 in order to restore the charges on the metal electrode 3 to $-Q$ corresponding to the supply voltage 4. The charge migration at this time is externally detected as a signal.

In the above process, when a surface insulating oxide film 3' overlies the metal electrode 3 as shown in FIG. 2, the holes 7 generated in the photoelectric conversion layer 2 are stored on the side of the surface oxide film 3' closer to the photoelectric conversion layer 2. Upon the subsequent closure of the switch 5, a high electric field is applied to the surface oxide film by the negative charges 8 supplied from the voltage source 4, and the negative charges 8 penetrate into the photoelectric conversion layer 2 owing to the tunneling effect. The penetrating negative charges 8' cannot cancel the stored holes 7', with the result that the dark current of the device increases and that the photo-response thereof deteriorates.

Examples of the solid-state imagers described above are disclosed in Japanese Published Unexamined Patent Application No. 51-10,715 (HITACHI), etc.

SUMMARY OF THE INVENTION

This invention makes it possible to handle a metal electrode having an insulating oxide film on its surface, as if the surface oxide film were not existent. An object of this invention is to provide a photosensor which has the dark current suppressed sufficiently and which exhibits a good photo-response.

In order to accomplish the object, according to this invention, a recombination layer for deliberately recombining electrons and holes is inserted between a photoelectric conversion layer and a metal electrode.

More specifically, in a photosensor having a metal electrode, at least one photoelectric conversion layer which overlies the metal electrode, and a transparent or partly transparent conductive layer which overlies the photoelectric conversion layer, the fundamental construction of this invention consists in comprising a recombination layer for deliberately recombining electrons and holes between the metal electrode and the photoelectric conversion layer.

Used for the recombination layer is an inorganic material which has a forbidden band gap of 0.8 eV–1.8 eV or so and which has a high localized state density in its forbidden band gap.

As the materials of this sort, $Sb_2S_3$, $As_2Se_3$, $As_2S_3$, $Sb_2Se_3$, $As_2Te_3$, $ZnSb$, $GaP$, $Pb_2S_3$, $AlSb$, $Bi_2S_3$, $GaSe$, etc. are typical examples. The thickness of the layer needs to be at least 50 Å.

BRIEF DESCRIPTION OF THE DRAWINGS

FIG. 7a is a diagram showing the pulse shape of incident light, while

DESCRIPTION OF THE PREFERRED EMBODIMENTS

Figure 3:
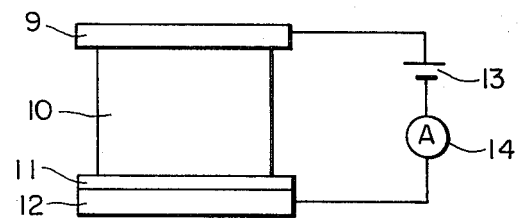
FIGS. 3, 6 and 8 are model diagrams each showing one picture element.

FIG. 3 is a diagram for explaining an arrangement for assessing the dark current of a photosensor. Referring to FIG. 3, numeral 9 designates a transparent conductive layer which also has the function of blocking the injection of holes, numeral 10 a photoelectric conversion layer which is made of amorphous Se and which is 10 μm thick, numeral 11 a recombination layer, numeral 12 a metal electrode, numeral 13 a voltage source, and numeral 14 an ammeter. The recombination layer 11 is made of $As_2Se_3$ in this example.

The transparent conductive layer may well be a partly transparent conductive layer. For example, a meshed metal film can also be employed.

For the photoelectric conversion layer, an amorphous material or a crystalline material can be used. Typical examples of the amorphous material are an Se-As-Te-based material and amorphous Si containing hydrogen, and those of the crystalline material are CdSe, CdTe, PbS, etc.

Techniques for applying the Se-As-Te-based material and the amorphous Si containing hydrogen to solid-state imagers have been applied for patents and are pending in the United States (Serial No. 154,999 1979, Serial No. 66,239 1978).

Figure 1:
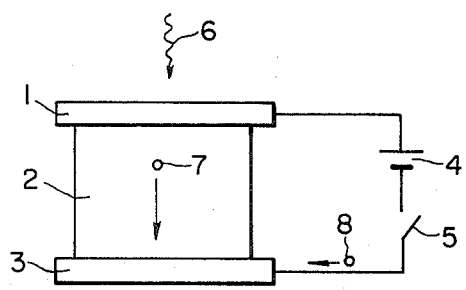
FIGS. 1 and 2 are diagrams each showing the operating principle of one picture element of a solid-state imager.
Figure 2:
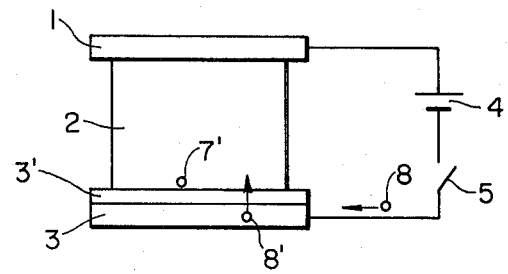
Figure 4:
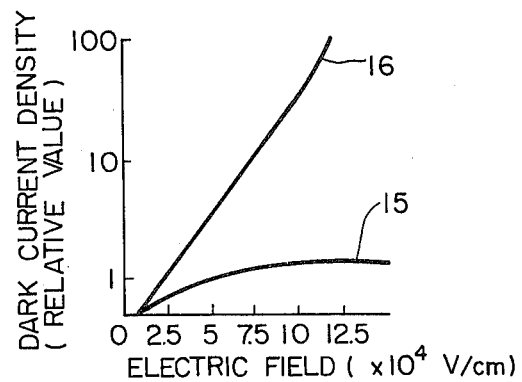
FIG. 4 is a graph showing the relationship between the applied electric field and the dark current.
Figure 5:
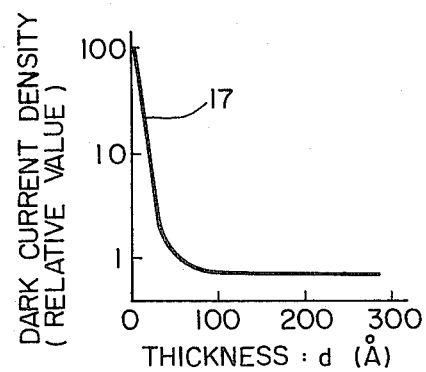
FIG. 5 is a graph showing the relationship between the thickness of a recombination layer and the dark current.

The relationship between the applied electric field intensity E and the dark current $I_d$ as measured with such arrangement is illustrated in FIG. 4. The dark current is indicated by relative values. The characteristic in the case where the metal electrode 12 in FIG. 3 has no surface oxide film ought to become one in which the dark current is sufficiently suppressed as illustrated at 15 in FIG. 4. On the other hand, the characteristic in the case where Al having a surface oxide film is employed for the metal electrode 12 in FIG. 3 and where the recombination layer 11 is not inserted has not the dark current suppressed as illustrated at 16 in FIG. 4. In this case, when the recombination layer 11 of $As_2Se_3$ is inserted, the characteristic curve of the dark current becomes that shown at 15 in FIG. 4. Numeral 17 in FIG. 5 illustrates the relationship between the thickness d of the recombination layer and the dark current $I_d$ at that value of the supply voltage at which the photosensor can be driven under good characteristics. As apparent from the characteristic curve 17 in FIG. 5, the thickness d at which the recombination layer functions is at least 50 Å. When this layer is too thick, a signal itself decreases. Therefore, the thickness is made, in general, at most 5,000 Å and more preferably, at most 3,000 Å. The thickness is determined in accordance with a requirement for the resolution. When the thickness is less than 50 Å, the number of levels in a forbidden band gap as can annihilate the electrons shown at 8' in FIG. 2 and having penetrated into the photoelectric conversion layer 2 is insufficient, and the characteristic of the dark current as illustrated in FIG. 4 becomes intermediate between the curves 15 and 16.

Figure 6:
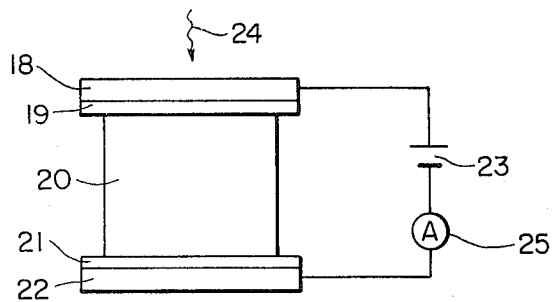

FIG. 6 is a diagram of an arrangement for assessing the photo-response of a photosensor. Referring to FIG. 6, numeral 18 designates a transparent Au electrode, numeral 19 a layer for blocking the injection of holes from the Au electrode 18, numeral 20 a photoelectric conversion layer made of amorphous Se-As-Te, numeral 21 a recombination layer made of $Sb_2S_3$, numeral 22 a metal electrode, numeral 23 a voltage source, numeral 24 incident light, and numeral 25 an ammeter.

Figure 7A:
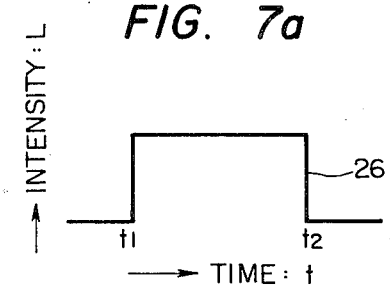
Figure 7B:
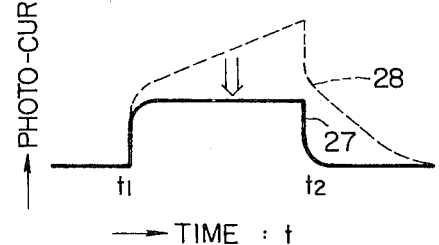
FIG. 7b is a diagram for explaining the photo-response.

In case where pulse light 26 as shown in FIG. 7a is employed as the incident light 24, where Cr having a surface oxide film is used for the metal electrode 22 and where the recombination layer 21 is not inserted, a photo-response in which the photo-current varies slowly with time as shown at 28 in FIG. 7b is obtained, and it is unusable for practical devices. In this case, however, when the recombination layer 21 made of $Sb_2S_3$ and having a thickness of at least 50 Å is inserted, the photo-response becomes as shown at 27, and it poses no problem in practical use. The slow variation of the photo-current with time as illustrated at 28 in FIG. 7b is ascribable to the modulation of the dark current during the light projection.

As set forth above, with the recombination layer of this invention, the metal electrode having the surface insulating oxide film can be handled as if the surface oxide film were not existent. While, in the foregoing examples, the recombination layer has been used in order to suppress the dark current of the photosensor, it can also be used in order to contrariwise achieve the effect of establishing the ohmic contact between the metal electrode having the surface oxide film and the photoelectric conversion layer. This will be described with reference to FIG. 8.

Figure 8:
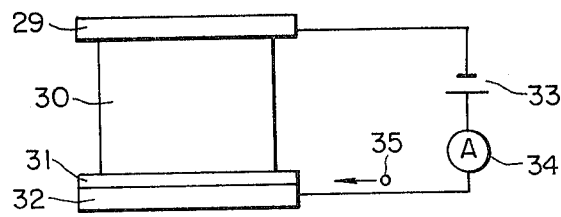

In FIG. 8, numeral 29 indicates a transparent Au electrode, numeral 30 a photoelectric conversion layer made of amorphous Se, numeral 31 a recombination layer made of $As_2S_3$, numeral 32 a metal electrode, numeral 33 a voltage source, and numeral 34 an ammeter. It is noteworthy that the polarity of the supply voltage is opposite to that in the case of the discussion on FIGS. 1 to 6.

Figure 9:
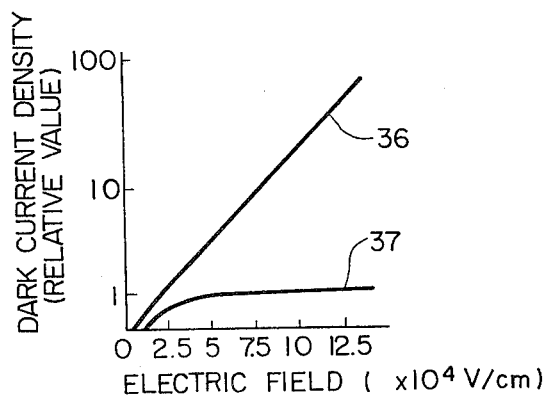
FIG. 9 is a graph showing the relationship between the supply voltage and the dark current.

The dependency of the dark current $(I_d)$ in this bias direction upon the supply voltage (V) is illustrated in FIG. 9. In case where the metal electrode 32 is made of Al having a surface oxide film and where the recombination layer 31 is not disposed, positive charges 35 which are supplied from the voltage source 33 through the metal electrode 32 to the photoelectric conversion layer 30 are blocked by the surface oxide film, and the dark current is suppressed as shown at 37 in FIG. 9. In this case, however, when the recombination layer 31 made of $As_2S_3$ exists, the dark current density becomes an ohmic characteristic as shown at 36 in FIG. 9.

Figure 10:
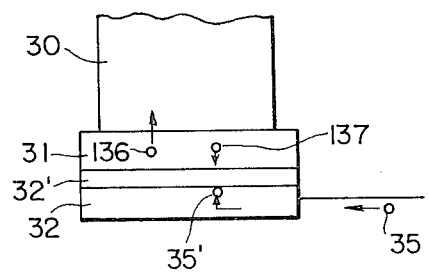
FIG. 10 is a model diagram for explaining the effect of this invention.

The function of the recombination layer in this case will be described with reference to FIG. 10. The structure of a photoelectric conversion portion is the same as in the case of FIG. 8. The positive charges 35 supplied from the voltage source to the metal electrode 32 are checked from penetrating into the photoelectric conversion layer 30 by the surface oxide film 32' of the metal electrode 32 and are stored as shown at 35' in FIG. 10. At this time, among electrons 137 and holes 136 generated in the recombination layer 31 by thermal excitation, the holes 136 are injected into the photoelectric conversion layer 30, and the electrons 137 are stored on the side of the surface oxide film 32' closer to the recombination layer. A high electric field is applied to the surface oxide film 32' by the electrons 137' and the above-stated stored holes 35', the holes 35' or the electrons 137 pass through the surface oxide film, and both are recombined. Thus, in effect, the characteristic becomes as if the surface oxide film 32' were not existent.

Hereunder, this invention will be described in detail with reference to examples.

EXAMPLE 1

Figure 11:
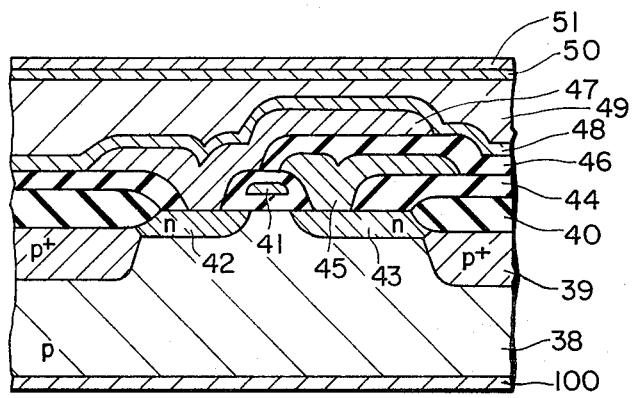
FIGS. 11 and 12 are sectional views of picture elements each showing an embodiment of this invention.

FIG. 11 is a schematic sectional view of a solid-state imager which is an embodiment of this invention. A MOS transistor was formed on a p-type silicon substrate 38. A $p^+$-type conductive region 39 and an oxide film 40 were for isolation, and oxide films 44 and 46 were insulating oxide films. Aluminum electrodes 47 and 45 were respectively formed on a source region 42 and a drain region 43. In order to fabricate a picture converter device, the electrodes are naturally made a very fine pattern in the shape of a comb or a matrix. Numeral 41 indicates a gate electrode which was formed of polycrystalline Si. The structure thus far described is a semiconductor body portion which is usually called an "IC" or "LSI". Although the single element is shown in the figure, actually such elements are formed in two dimensions to construct the whole circuit. A recombination layer 48 made of $Sb_2S_3$ was formed on the aluminum electrode 47. The recombination layer 48 was evaporated to a thickness in a range of 50 Å–1,500 Å by the resistance heating in a vacuum of $1 \times 10^{-6}$ Torr. Subsequently, on the recombination layer 48, a photoelectric conversion layer 49 which was made of amorphous Se-As-Te and whose principal photo-carriers were holes was vacuum-evaporated to a thickness in a range of 1–10μ. On the photoelectric conversion layer 49, $CeO_2$ was evaporated in a range of 50–300 Å as a hole blocking layer 50. Further, a semitransparent layer 51 of Au which was 150 Å thick was evaporated on the layer 50 for blocking the injection of holes from the semi-transparent conductive layer. A second electrode 100 was evaporated on the rear surface of the semiconductor substrate. With this structure, a solid-state imager which has the dark current suppressed sufficiently and whose photo-response was good was obtained.

As the Se-Te-As-based photoconductive film of the solid-state imager of this invention, one of a construction to be stated below is particularly preferable. The following layers are formed on the body.

The first part is made up of an Se layer which contains at least one member selected from the group consisting of elements to form deep levels in Te or Se, and in which the quantities of the elements to form deep levels in Te or Se are at most 10 atomic-% on the average respectively.

However, in case where the lifetime is not a very important problem, a mere Se layer may well be used.

The elements considered to form deep levels in Se are group-Vb elements such as As, Sb and Bi and group-IV elements such as Si and Ge, and at least one of them or one of compounds each containing at least one of them may well be used. These elements may coexist with Te, or only these elements may be contained as well. With such elements forming deep levels, particularly even when the device is operated continuously for a long time, changes in a signal current are extraordinarily small, and the after-image is remarkably reduced.

This first part is usually made 0.5–10 μm thick, and it is principally effective for causing holes generated in the third part to travel so as to reduce the capacitance of the photoconductor and for eliminating pinholes etc. The thickness of this film should more desirably be 1–4 μm.

The second part is a part in which a dopant to form deep levels (in this case, As) is introduced in order to enhance the effect of intensifying the sensitivity to red by virtue of Te contained in the third part and also to suppress the signal current changes in the case of operating the device for a long time. In order to effectively achieve the functions, the second part needs to be an Se layer in which the concentration of the dopant to form deep levels is at least 15 atomic-% at the position of the peak of a continuous concentration distribution. In practical use, concentrations of at most 40 atomic-% are often employed. It is desirable that the concentration distribution of the dopant to form deep levels in the second part is in the shape in which the concentration is the highest at the interface of the second part lying in contact with the third part and decreases smoothly over 200–3,000 Å with the distance from the interface. This layer is usually used at a thickness of 100 Å–5,000 Å.

In order to attain a satisfactory sensitivity in the visible region, the third part needs to be an Se layer in which the peak concentration of the continuous distribution of Te concentrations is at least 15 atomic-% and particularly desirably falls in a range of 15–30 atomic-%. It is also desirable that the thickness of this part is 200–5,000 Å. The distribution of the Te concentrations of the third part is uniform and is rectangular, but the shape of the distribution is not restricted thereto. A distribution which is triangular, trapezoidal or semicircular or in a more complicated shape may be used as well. The fourth part is a part which is necessary for this film to lie in contact with the n-type transparent conductive film, to be disposed on the photoconductor layer, so as to form a rectifying contact. The Te concentration of this Se layer part must not exceed 15 atomic-% on the average to the end of establishing a stable rectifying contact, and an element such as As and Ge with which this part is doped in order to increase the thermal stability must not exceed 15 atomic-% on the average, either. The thickness of this part needs to be at least 100 Å. In case where the lifetime is not a very important problem, a mere Se layer may be used as well.

However, when the fourth part is made thicker than is necessary, the quantity of light entering the third part decreases to lower the sensitivity, so that a thickness of at most 1,000 Å is desirable in practical use.

The concentrations of Te, As, Ge etc. may be controlled by grasping the concentration distributions thereof as continuous distributions considered macroscopically.

In case of the photoconductive film in the present example, a film which has a macroscopically continuous distribution and which exhibits a desired composition ratio or composition distribution can be produced in such a way that by employing Se and $As_2Se_3$ or Te and Ge or the likes as vaporization sources and using a rotating type evaporation apparatus, several thousand layers of the vapors, each layer being several angstroms—several tens angstroms thick, are cyclically stacked on the body for the evaporation.

In this case, the composition ratio of the continuous distribution is defined to be the continuous distribution of an average composition ratio within a composite layer which is constructed of the sum of the respective layers of one sort or two or more sorts of vapors evaporated cyclically, that is, a composite layer which is formed by one cycle of the rotary evaporation.

EXAMPLE 2

The fundamental structure of this example is the same as in FIG. 11, and will therefore be described with reference thereto. A scanning circuit portion including a switching circuit etc. to be formed in a semiconductor body was fabricated by the use of the manufacturing steps of conventional semiconductor devices. A thin $SiO_2$ film of approximately 800 Å was formed on a p-type silicon substrate 38, and an $Si_3N_4$ film of approximately 1,400 Å was formed on a predetermined position of the $SiO_2$ film. The formation of the $SiO_2$ film was resorted to the ordinary CVD process, while that of the $SIN_4$ film was resorted to the CVD process in which $Si_3N_4$, $NH_4$ and $N_2$ were caused to flow. p-type diffused regions 39 were formed by the ion implantation which was carried out from above the silicon substrate. The diffused regions 39 were disposed in order to better the isolation of the respective elements. The silicon was subsequently oxidized locally in an atmosphere of $H_2:O_2=1:8$, to form an $SiO_2$ layer 40. This method is a process for the local oxidation of silicon for isolating elements as is usually called "LOCOS". The $Si_3N_4$ film and the $SiO_2$ film stated above were once removed, and a gate insulating film for a MOS transistor was formed of an $SiO_2$ film.

Subsequently, a gate portion 41 made of polycrystalline silicon and diffused regions 42 and 43 were formed, and an $SiO_2$ film 44 was formed thereon. Electrode lead-out openings for the source 42 and the drain 43 were provided in the film by etching. Al was evaporated 8,000 Å as a drain electrode 45. Further, an $SiO_2$ film 46 was formed to a thickness of 7,500 Å, and Al was subsequently evaporated 1 μm as a source electrode 47. The electrode 47 was formed to be extensive so as to cover the regions 42 and 43 and the gate portion 41. This is because the incidence of light on a signal processing region extending between the diffused layers 39 for isolating the elements forms a cause for blooming and is undesirable.

At the next step, on at least the aluminum electrodes, a recombination layer 48 made of $Sb_2S_3$ was formed to a thickness of 100 Å. The process for the formation was the same as stated before.

Subsequently, the semiconductor body prepared by the steps thus far described was installed in a magnetron type sputtering equipment. An atmosphere used was a gaseous mixture consisting of Ar and hydrogen, and was held at 0.2 Torr. The hydrogen content was 6 mol-%. A sputter target used was made of silicon. By carrying out a reactive sputtering at a frequency of 13.56 MHz and an input power of 300 W, a thin film 49 of amorphous silicon containing hydrogen was deposited on the semiconductor body to a thickness of 500 nm. The hydrogen content of the amorphous thin film was 20 atomic-%, and the resistivity thereof was $5 \times 10^{13}$ Ω.cm.

The photoconductive thin film is of an amorphous material whose principal constituent is silicon containing hydrogen. Especially favorable as this material is an amorphous material which contains at least 50 atomic-% of silicon and 5 atomic-% to 50 atomic-% of hydrogen. In this case, part of the silicon in the amorphous material can be substituted by germanium which is an element of the same group. Regarding the amount of the substitution, up to 60% of the silicon is useful.

As the thickness of the film, 0.2 μm-4 μm is often employed in practical use. The thin film may be in a multilayer form or have its composition varied continuously as well.

A first electrode for a bias voltage needs to be disposed on the amorphous silicon thin film 49. Since, in this example, light needed to enter from above, the electrode was made a transparent electrode. As the heat resistance of the amorphous silicon was 300° C., a transparent electrode made of $In_2O_3$ was used. The transparent electrode of $In_2O_3$, per se, plays the role of a hole blocking layer 50. Accordingly, the hole blocking layer 50 shown in FIG. 11 is unnecessary. Using a mask, Cr-Au was evaporated onto that part of the transparent electrode which was not a light receiving part, and a wire was bonded thereto, to finish up the biasing electrode. In addition, a second electrode 100 was formed of an Au film or the like on the rear surface of the semiconductor body. In this way, a solid-state imager was completed.

With this structure, the dark current was suppressed sufficiently.

EXAMPLE 3

In Example 1, for a recombination layer indicated at 48 in FIG. 11, GaSe was evaporated to a thickness in a range of 50 Å-3,000 Å by the electron-beam evaporation in a vacuum of $2 \times 10^{-5}$ Torr. On the recombination layer, amorphous Si containing 20% of hydrogen was formed as a photoelectric conversion layer 49 to a thickness of 2 μm by the radio-frequency sputtering at a substrate temperature of 250° C. Subsequently, Pt at a thickness of 60 Å was evaporated as a transparent conductive layer 51 by the electron-beam evaporation in a vacuum of $1 \times 10^{-6}$ Torr. In this case, the major photocarriers of the photoelectric conversion layer were electrons. An electron injection blocking layer corresponding to the hole injection blocking layer in Example 1 was unnecessary. With the device of this structure, a solid-state imager having good imaging characteristics was obtained.

A similar effect can be achieved even when the material of the recombination layer is at least one member selected from the group consisting of $As_2S_3$, $Sb_2Se_3$, $As_2Te_3$, ZnSb, GaP, $Pb_2S_3$, AlSb and $Bi_2S_3$. Further, two or more of the aforecited materials for the recombination layer can be mixed and used. For example, a mixture consisting of $Sb_2S_3$ and $As_2Se_3$, a mixture consisting of $Sb_2S_3$ and $As_2S_3$, or the like can be used.

EXAMPLE 4

Figure 12:
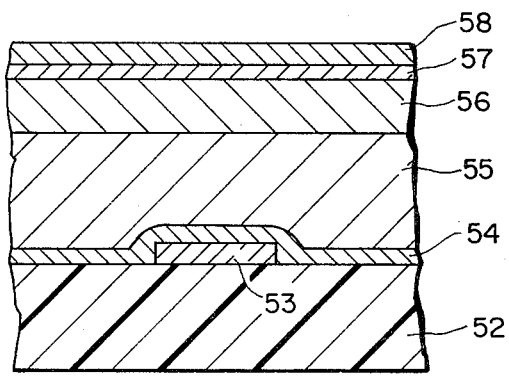

FIG. 12 is a schematic sectional view of a line sensor which is an embodiment of this invention.

On a surface-polished plastic substrate 52 which was worked to be opaque, a Cr electrode 53 was formed by the resistance heating evaporation in a vacuum of $1 \times 10^{-5}$ Torr. Subsequently, $As_2Se_3$ was formed as a recombination layer 54 to a thickness in a range of 50 Å-5,000 Å by the resistance heating method in a vacuum of $5 \times 10^{-6}$ Torr. On the recombination layer, a first photoelectric conversion layer 55 made of amorphous Se-As and having a thickness of 5 μm and a second photoelectric conversion layer 56 made of amorphous Se-As-Te and having a thickness of 0.08 μm were successively evaporated in a vacuum of $1 \times 10^{-6}$ Torr. Subsequently, as a transparent conductive layer 57 which had also the function of blocking the injection of holes, a film having a thickness of 200 Å and made of $In_2O_3$ and $SnO_2$ was formed at a substrate temperature of 40° C. by the magnetron sputtering process. At the next step, as a surface protective layer 58, $SiO_2$ at a thickness of 2,000 Å was formed at a substrate temperature of 50° C. by the intermittent sputtering process. Although a single element is shown in the figure, actually such elements are linearly arrayed so as to construct the linear sensor.

In case where, as in Examples 1-3, the recombination layer of this invention is used on the metal electrode having the surface oxide film divided into the very fine pattern, it needs to have a resistance greater than a certain value in order to prevent the transverse flow of carriers. The required resistance of the recombination layer was determined by employing the structure of the target of a conventional vidicon type image pickup tube as shown in FIG. 13.

The use of the image pickup tube for determining the resistance itself of the recombination layer involves no problem. This method was adopted because of an easy measurement.

Figure 13:
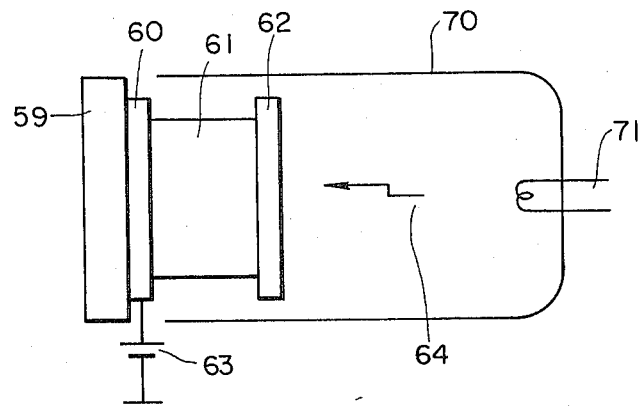
FIG. 13 is a schematic explanatory view of an apparatus for measuring the relationship between the resistivity and the resolution.
Figure 14:
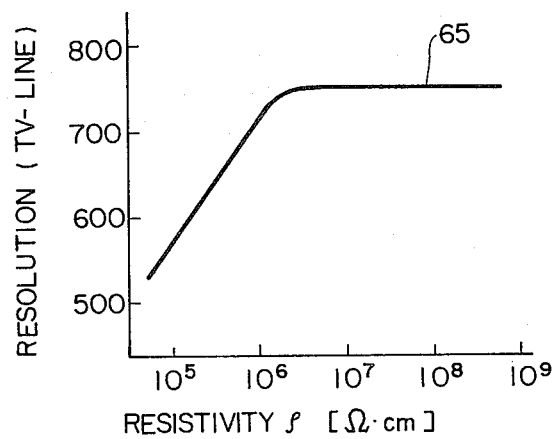
FIG. 14 is a graph showing the relationship between the resistivity of a recombination layer and the resolution.

In FIG. 13, numeral 59 indicates a glass substrate, numeral 60 a transparent conductive layer which also has the function of blocking the injection of holes, numeral 61 a photoelectric conversion layer which is 6 μm thick and which is made of amorphous Se, numeral 62 a recombination layer which is 500 Å thick, numeral 63 a voltage source, and numeral 64 a scanning electron beam. Numeral 70 indicates an envelope, and numeral 71 an electron gun. The construction other than the target, including structural parts not shown, is quite the same as in the image pickup tube. The relationship between the resistivity and the resolution of a picture was evaluated by imaging respective resolution patterns in the case where the resistivity $\rho$ was varied by changing the material of the recombination layer 62. The result is illustrated by a curve 65 in FIG. 14. To scan the recombination layer with the electron beam in this manner is equivalent to the fact that the metal electrode is split into the very fine pattern. As apparent from the result of the curve 65 in FIG. 14, the material of the recombination layer needs to have a resistivity of at least $10^6 \Omega.cm$. Of course, the resistivity of the material of the recombination layer needs to be lower than that of the photoelectric conversion material, and hence, values of $10^{12}$–$10^{13}$ $\Omega.cm$ will be the upper limit in practical use.

As set forth above, according to this invention, the metal electrode having the surface oxide film can be handled as if the surface oxide film were not existent. Needless to say, the expedient of this invention is accordingly applicable to improvements of the characteristics of electrical contact with electrodes in, not only the solid-state imager, the line sensor etc. referred to in the embodiments, but also other various photoelectric conversion devices such as solar batteries.

What is claimed is:

1. In a photosensor having at least a metal electrode, at least one means of effecting photoelectric conversion which comprises a layer of photoelectric material and which overlies the metal electrode, and a transparent or partly transparent conductive layer which overlies the means for effecting photoelectric conversion; said photosensor being characterized by comprising means for recombining electrons and holes in the form of a recombination layer of inorganic material arranged between said metal electrode and the photoelectric material layer; said inorganic material comprising at least one member selected from the group consisting of $Sb_2S_3$, $As_2Se_3$, $As_2S_3$, $Sb_2Se_3$, $As_2Te_3$, $ZnSb$, $GaP$, $Pb_2S_3$, $AlSb$, $Bi_2S_3$ and $GaSe$.

2. A photosensor according to claim 1, characterized in that said recombination layer is made of an inorganic material whose forbidden band gap is 0.8 eV to 1.8 eV and which has a high localized state density in the forbidden band gap.

3. A photosensor according to claim 1 characterized in that said recombination layer has a thickness of 50 Å to 5,000 Å.

4. A photosensor according to claim 1 or claim 2 characterized in that said recombination layer has a resistivity of at least $10^6$ $\Omega.cm$.

5. A photosensor according to claim 1 or claim 2 characterized in that a plurality of photoelectric conversion portions are arrayed on a predetermined semiconductor substrate, that said semiconductor substrate includes at least scanning means for sequentially selecting said plurality of photoelectric conversion portions, and that said metal electrode is disposed on said semiconductor substrate and functions as one electrode of said plurality of photoelectric conversion portions arrayed on said semiconductor substrate.

6. A photosensor according to claim 1, characterized in that said metal electrode has an insulating oxide film on a surface located between said metal electrode and said recombination layer; said recombination layer being sufficiently thick to provide a photosensor which has the dark current suppressed sufficiently and which exhibits good photoresponse.

7. A photosensor according to claim 6, characterized in that said recombination layer has a thickness of at least 50 Å.

8. A photosensor according to claim 7, characterized in that said recombination layer is made of an organic material having a forbidden band gap of 0.8 eV to 1.8 eV.

9. A photosensor according to claim 1, characterized in that said photoelectric material is an amorphous or crystalline material.

10. A photosensor according to claim 9, characterized in that said amorphous material comprises an amorphous selenium-based material or an amorphous silicon-containing hydrogen.

11. A photosensor according to claim 9, wherein said crystalline material comprises CdSe, CdTe or PbS.

12. A photosensor according to claim 10, wherein said amorphous material is Se-As-Te-based material.

* * * * *